(12) United States Patent
Lee et al.

(10) Patent No.: US 10,454,074 B2
(45) Date of Patent: Oct. 22, 2019

(54) ORGANIC LIGHT EMITTING DISPLAY

(71) Applicant: Samsung Display Co., Ltd., Yongin-si, Gyeonggi-do (KR)

(72) Inventors: Yuseok Lee, Seongnam-si (KR); Sunggi Kim, Seoul (KR); Jinmin Chung, Hwaseong-si (KR); Jungho Hwang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 24 days.

(21) Appl. No.: 15/357,705

(22) Filed: Nov. 21, 2016

(65) Prior Publication Data

US 2017/0186992 A1    Jun. 29, 2017

(30) Foreign Application Priority Data

Dec. 24, 2015   (KR) .................... 10-2015-0186463

(51) Int. Cl.
 *H01L 51/52*   (2006.01)
 *H01L 27/32*   (2006.01)

(52) U.S. Cl.
 CPC ........ *H01L 51/529* (2013.01); *H01L 51/5253* (2013.01); *H01L 51/5284* (2013.01); *H01L 27/3244* (2013.01); *H01L 51/524* (2013.01)

(58) Field of Classification Search
 CPC ............... H01L 51/529; H01L 51/5253; H01L 27/3244; H01L 27/3225
 See application file for complete search history.

(56) References Cited

U.S. PATENT DOCUMENTS

| 2006/0292461 A1 | 12/2006 | Shives et al. |
| 2010/0007258 A1* | 1/2010 | Iwata ............... H01J 11/10 313/12 |
| 2011/0018416 A1* | 1/2011 | Sassa ............... H01L 51/529 313/45 |
| 2011/0175102 A1* | 7/2011 | Hatano ............ H01L 27/1266 257/72 |

FOREIGN PATENT DOCUMENTS

| JP | 2004-053786 A | 2/2004 |
| KR | 10-0696501 B1 | 3/2007 |
| KR | 10-2008-0093642 A | 10/2008 |
| KR | 10-1277865 B1 | 6/2013 |
| KR | 10-2014-0048644 A | 4/2014 |
| WO | WO 2015/093825 A1 | 6/2015 |

\* cited by examiner

*Primary Examiner* — Jamie C Niesz
(74) *Attorney, Agent, or Firm* — Lewis Roca Rothgerber Christie LLP

(57) ABSTRACT

An organic light emitting display includes: an organic light emitting display panel including a light emitting surface and a non-light emitting surface opposite the light emitting surface; a heat radiation layer on the non-light emitting surface and having an emissivity equal to or greater than about 0.8 and less than about 1; and a protective member spaced from the heat radiation layer such that an air layer is between the protective member and the heat radiation layer. The protective member includes a base layer and a heat absorbing layer having an emissivity greater than an emissivity of the base layer.

20 Claims, 16 Drawing Sheets

ORGANIC LIGHT EMITTING DISPLAY

CROSS-REFERENCE TO RELATED APPLICATION

This application claims priority to and the benefit of Korean Patent Application No. 10-2015-0186463, filed on Dec. 24, 2015 in the Korean Intellectual Property Office, the content of which is herein incorporated by reference in its entirety.

BACKGROUND

1. Field of Disclosure

The present disclosure relates to an organic light emitting display.

2. Description of the Related Art

Various displays applied to multimedia devices, such as television sets, mobile phones, tablet computers, navigation units, game units, etc., have been developed.

One such display, an organic light emitting diode (OLED) display (or organic light emitting display), has been presented. The OLED display is a self-emissive display device and has advantages, such as a wide viewing angle, a high contrast ratio, a fast response time, etc.

The OLED display includes an organic light emitting display panel, and recently, a variety of methods for discharging heat generated by the organic light emitting display panel to outside of the OLED display has been developed.

For example, Republic of Korea Patent No. 10-1524728 (International Patent Application Publication No. WO2015-093825), titled "HIGH-HEAT DISSIPATION CERAMIC COMPOSITE, METHOD FOR MANUFACTURING SAME, AND USE THEREOF," discloses a heat dissipation agent having high emissivity.

SUMMARY

The present disclosure provides an organic light emitting display having high durability against external impacts and effective dissipation of heat generated by an organic light emitting display panel.

Embodiments of the inventive concept provide an organic light emitting display including an organic light emitting display panel, a heat radiation layer, and a protective member. According to one embodiment, an organic light emitting display includes: an organic light emitting display panel including a light emitting surface and a non-light emitting surface opposite the light emitting surface; a heat radiation layer on the non-light emitting surface and having an emissivity equal to or greater than about 0.8 and less than about 1; and a protective member spaced from the heat radiation layer such that an air layer is between the protective member and the heat radiation layer. The protective member includes a base layer and a heat absorbing layer having an emissivity greater than an emissivity of the base layer.

The base layer may include a material, and the heat absorbing layer may include an oxide of the material of the base layer.

The base layer may include aluminum.

The heat absorbing layer may have a black color.

The organic light emitting display may further include a plurality of adhesive members between the organic light emitting display panel and the protective member and coupling the organic light emitting display panel and the protective member to each other.

Each of the adhesive members may have a plurality of air holes.

Each of the adhesive members may have a heat conductivity greater than a heat conductivity of the organic light emitting display panel.

The organic light emitting display may further include: a first data driver adjacent to a first side of the organic light emitting display panel; and a second data driver adjacent to a second side of the organic light emitting display panel. One of the adhesive members may be adjacent to the first side or the second side of the organic light emitting display panel.

The organic light emitting display may further include a heat radiation layer on one surface of the base layer, and the heat radiation layer may have an emissivity equal to or greater than about 0.8 and less than about 1.

The organic light emitting display may further include: a driving circuit board for controlling signals to drive the organic light emitting display panel; and a heat dissipation member adjacent to the driving circuit board to block heat dissipated from the driving circuit board to the organic light emitting display panel.

The organic light emitting display may further include a heat radiation layer on the heat dissipation member, and the heat radiation layer may have an emissivity equal to or greater than about 0.8 and less than about 1.

The organic light emitting display may further include a bottom cover in which the organic light emitting display panel, the protective member, the driving circuit board, and the heat dissipation member are arranged. The bottom cover may include a heat radiation layer having an emissivity equal to or greater than about 0.8 and less than about 1.

The heat absorbing layer may include copper.

The heat absorbing layer may have a black color.

The base layer may include aluminum.

The heat absorbing layer may include a heat radiation layer having an emissivity equal to or greater than about 0.8 and less than about 1.

The heat radiation layer may include a heat radiation paint.

The heat radiation layer may have a thickness equal to or greater than about 20 micrometers and equal to or less than about 50 micrometers.

The heat radiation layer may include at least one of iron oxide, silicon oxide, magnesium oxide, or aluminum oxide.

According to another embodiment, a display device includes: an organic light emitting display panel including a first surface providing image information and a second surface coated with a heat radiation paint having an emissivity equal to or greater than about 0.8 and less than about 1; and a protective member spaced from the organic light emitting display panel and including a surface facing the second surface of the organic light emitting display panel. The surface of the protective member includes a metal oxide layer configured to absorb heat radiated from the heat radiation paint.

According to the above, because space exists between the organic light emitting display panel and the protective member, the organic light emitting display may not be damaged even though external impacts are applied to the organic light emitting display. In addition, the organic light emitting display may effectively dissipate heat through the heat radiation layer disposed on the non-light emitting surface of the organic light emitting display panel.

DESCRIPTION OF THE DRAWINGS

The above and other aspects and features of the present disclosure will become readily apparent by reference to the following detailed description when considered in conjunction with the accompanying drawings, wherein.

DETAILED DESCRIPTION

Figure 1:
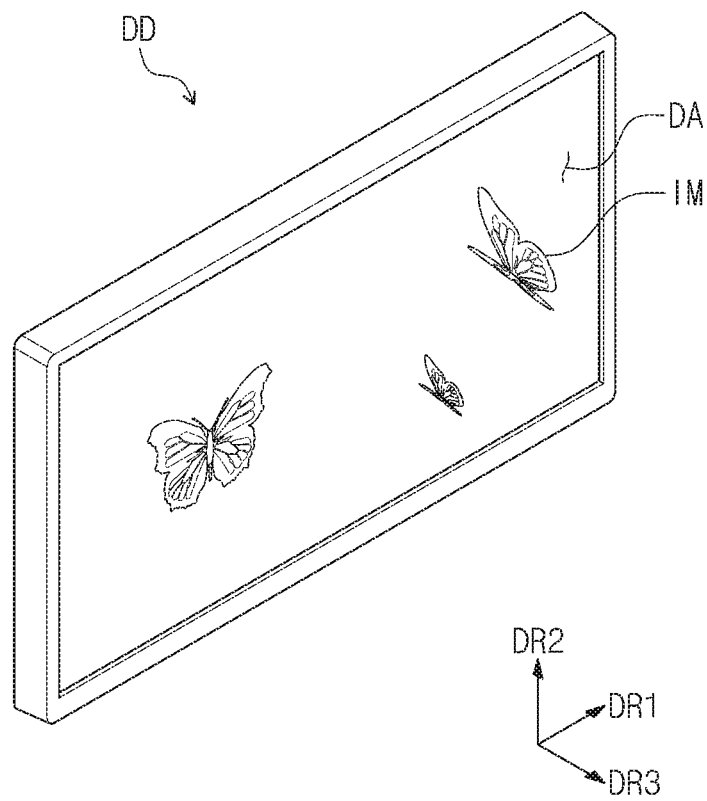
FIG. 1 is a perspective view of an organic light emitting display device according to an exemplary embodiment of the present disclosure.

The following description, with reference to the accompanying drawings, is provided to assist in a comprehensive understanding of various exemplary embodiments of the present disclosure as defined by the claims and their equivalents. The description includes various details to assist in that understanding, but such details are to be regarded as merely exemplary. Accordingly, those of ordinary skill in the art will recognize that various changes and modifications can be made to the various embodiments described herein without departing from the scope and spirit of the present disclosure. In addition, descriptions of well-known functions and constructions may be omitted for clarity and conciseness.

Hereinafter, exemplary embodiments of the present invention will be explained, in detail, with reference to the accompanying drawings.

It will be understood that when an element or layer is referred to as being "on," "connected to," or "coupled to" another element or layer, it may be directly on, connected, or coupled to the other element or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

The scan driver, the data driver, the timing controller, and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the scan driver and/or the data driver may be formed on one integrated circuit (IC) chip or on separate IC chips. Further, the various components of the scan driver and/or the data driver may be implemented on a flexible printed circuit film, a tape carrier package (TCP), a printed circuit board (PCB), or formed on a same substrate as the scan driver and/or the data driver. Further, the various components of the scan driver and/or the data driver may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

Figure 2:
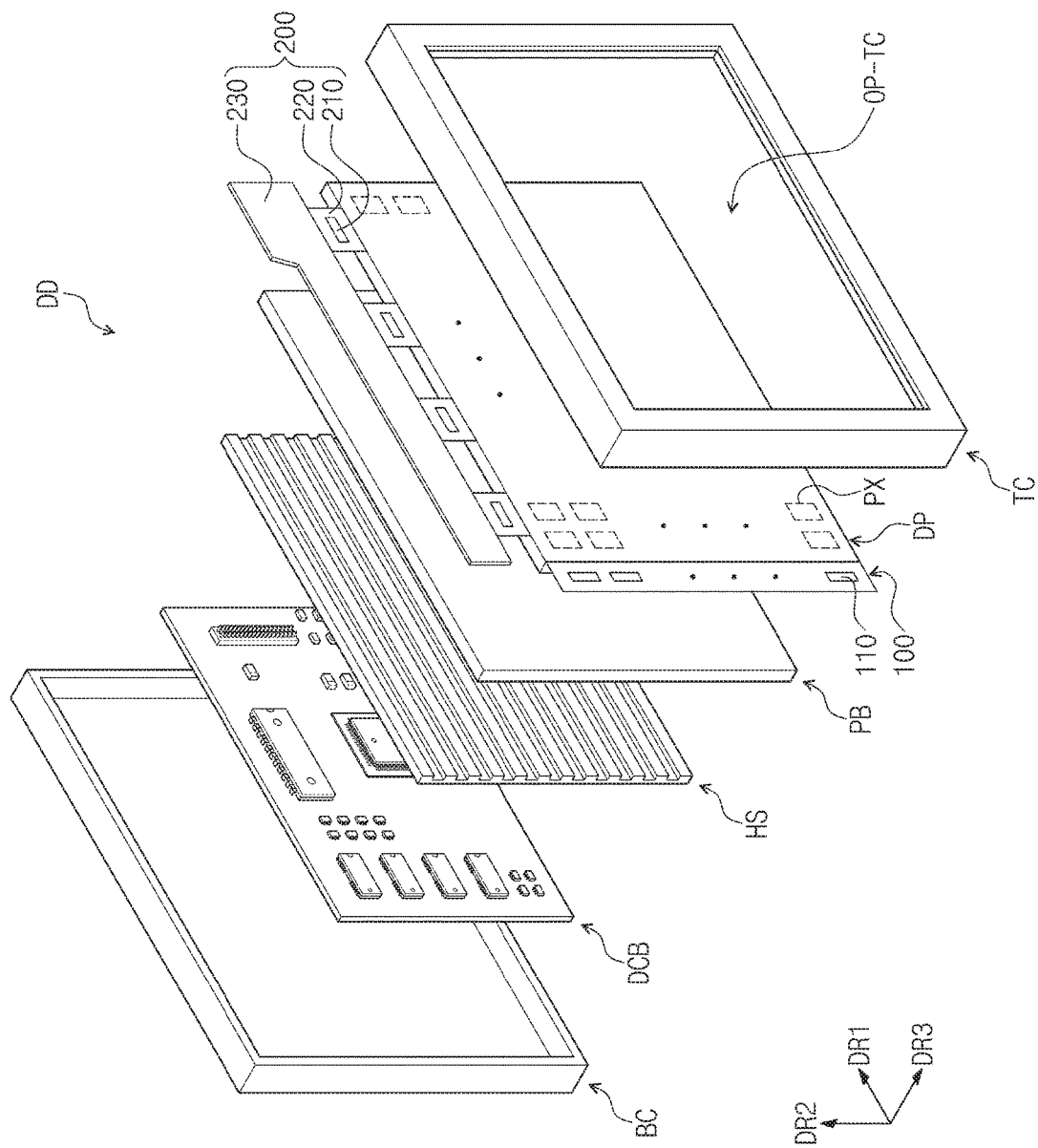
FIG. 2 is an exploded perspective view of the organic light emitting display device shown in FIG. 1.

FIG. 1 is a perspective view of an organic light emitting display device DD according to an exemplary embodiment of the present disclosure, and FIG. 2 is an exploded perspective view of the organic light emitting display device DD shown in FIG. 1. However, the present invention is not limited to the organic light emitting display device and can be applied to other display devices, such as a liquid crystal display (LCD) device.

Referring to FIGS. 1 and 2, the display device DD includes a top cover TC, an organic light emitting display panel DP, a scan driver 100, a data driver 200, a protective member PB, a driving circuit board DCB, and a bottom cover BC.

As shown in FIG. 1, the display device DD provides image information IM to a viewer (e.g., displays an image IM) through a display area DA. As a representative example of the image IM, a butterfly is shown in FIG. 1.

The top cover TC protects the organic light emitting display panel DP. The top cover TC has an opening OP-TC formed therethrough, and a front surface of the organic light emitting display panel DP is exposed through the opening OP-TC as a display area DA (e.g., a portion of the front surface of the organic light emitting display panel DP exposed through the opening OP-TC is the display area DA).

The protective member PB (e.g., a bottom chassis) includes a base layer and a heat absorbing layer. The heat absorbing layer has an emissivity greater than that of the base layer. The heat absorbing layer may be, but is not limited to, a heat radiation layer formed of an oxide layer, a copper layer, or a heat radiation paint. This will be described in further detail with reference to FIGS. 8-10.

Figure 3:
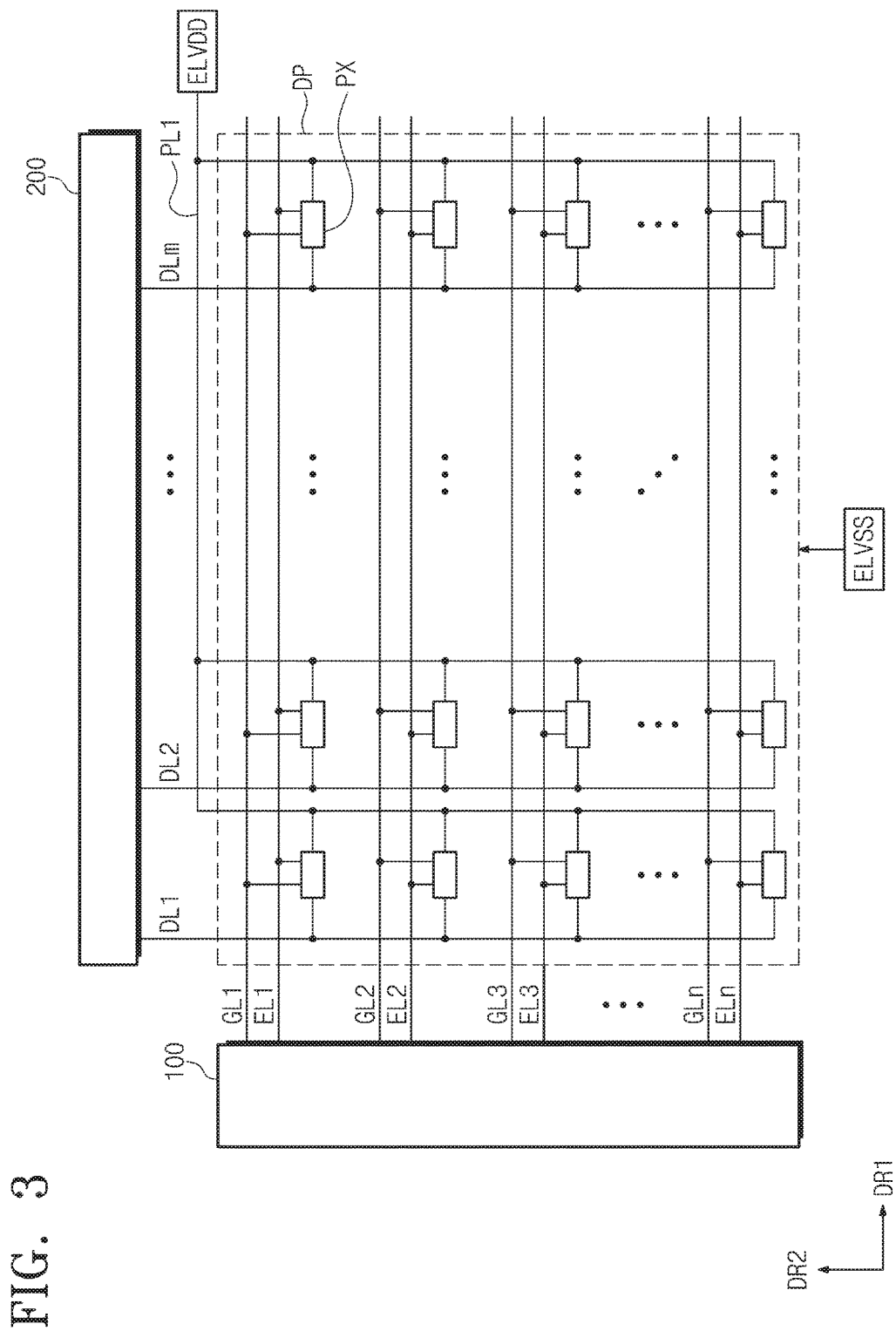
FIG. 3 is a block diagram of an organic light emitting display device according to an exemplary embodiment of the present disclosure.

FIG. 3 is a block diagram of an organic light emitting display device DD according to an exemplary embodiment of the present disclosure. Referring to FIG. 3, the organic light emitting display device DD includes the scan driver 100, the data driver 200, and the organic light emitting display panel DP.

The scan driver 100 includes a plurality of stages 110 (see FIG. 2). The scan driver 100 receives a gate control signal from a timing controller. The gate control signal includes a vertical start signal for starting an operation of the scan driver 100 and a clock signal for determining an output timing of signals. The scan driver 100 generates a plurality of gate signals and sequentially applies the gate signals to gate lines GL1 to GLn, to be further described later. In addition, the scan driver 100 generates a plurality of light emitting control signals in response to the gate control signal and applies the light emitting control signals to light emitting lines EL1 to ELn, to be further described later.

In FIG. 3, the gate signals and the light emitting control signals are output from one scan driver 100, but the present invention is not limited thereto or thereby. For example, the gate signals and the light emitting control signals may be output from plural scan drivers. In addition, a driving circuit for generating the gate signals may be provided separately from a driving circuit for generating the light emitting control signals.

The data driver 200 receives a data control signal and image data from the timing controller. The data driver 200 converts the image data to data signals and applies the data signals to a plurality of data lines DL1 to DLm, which cross and are insulated from the gate lines GL1 to GLn and the light emitting lines EL1 to ELn. The data signals are analog voltages corresponding to grayscale values of the image data.

The organic light emitting display panel DP includes the gate lines GL1 to GLn, the light emitting lines EL1 to ELn, the data lines DL1 to DLm, and a plurality of pixels PX. The gate lines GL1 to GLn extend in a first direction DR1 and are arranged along a second direction DR2 which is substantially perpendicular to the first direction DR1. Each of the light emitting lines EL1 to ELn is substantially parallel to a corresponding gate line from among the gate lines GL1 to GLn. The data lines DL1 to DLm cross and are insulated from the gate lines GL1 to GLn and the light emitting lines EL1 to ELn.

Each of the pixels PX is connected to a corresponding gate line from among the gate lines GL1 to GLn, a corresponding light emitting line from among the light emitting lines EL1 to ELn, and a corresponding data line from among the data lines DL1 to DLm.

Figure 4:
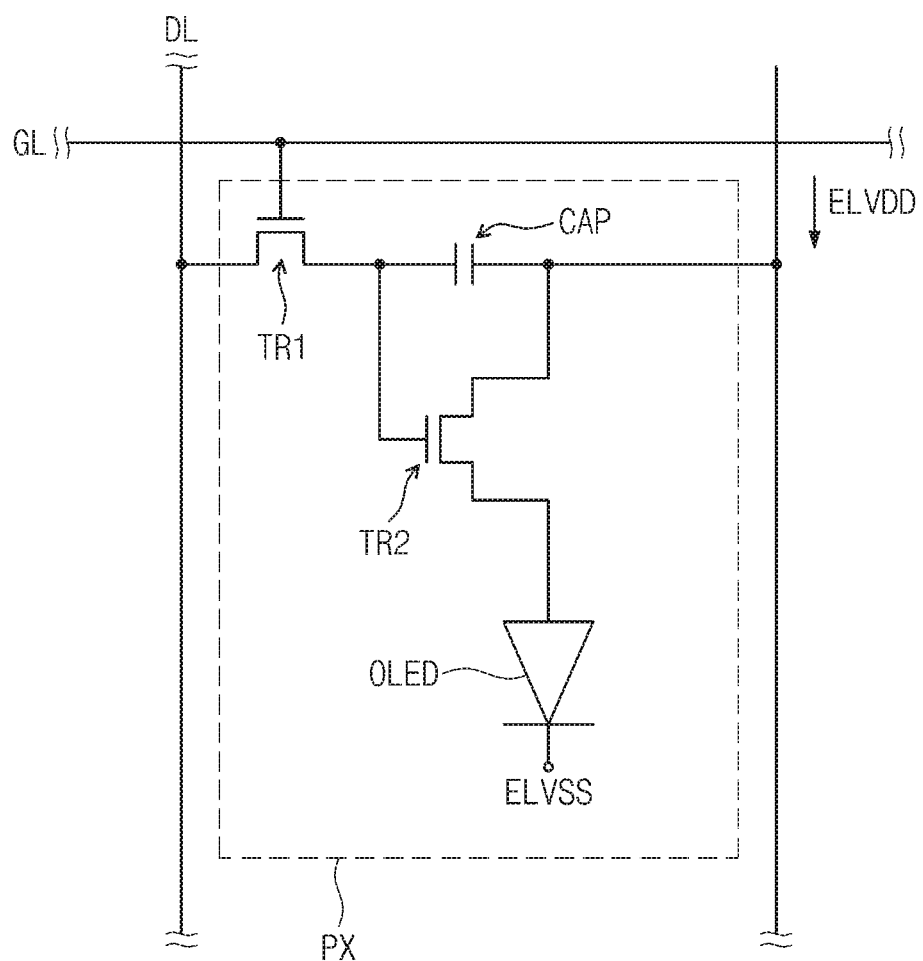
FIG. 4 is an equivalent circuit diagram of a pixel of an organic light emitting display panel according to an exemplary embodiment of the present disclosure.

FIG. 4 is an equivalent circuit diagram of a pixel of an organic light emitting display panel according to an exemplary embodiment of the present disclosure. As shown in FIG. 4, each of the pixels PX includes an organic light emitting diode OLED and a circuit (e.g., a circuit part) for controlling the organic light emitting diode OLED. The circuit includes a first transistor TR1, a second transistor TR2, and a capacitor CAP, but the equivalent circuit diagram of each pixel PX should not be limited to that shown in FIG. 4.

The first transistor TR1 includes a control electrode connected to a gate line GL, an input electrode connected to a data line DL, and an output electrode. The first transistor TR1 outputs the data signal applied to the data line DL in response to the gate signal applied to the gate line GL.

The capacitor CAP includes a first electrode connected to the first transistor TR1 and a second electrode for receiving a first power source voltage ELVDD. The capacitor CAP is charged by a voltage corresponding to the data signal provided from the first transistor TR1.

The second transistor TR2 includes a control electrode connected to the output electrode of the first transistor TR1 and the first electrode of the capacitor CAP, an input electrode for receiving the first power source voltage ELVDD, and an output electrode. The output electrode of the second transistor TR2 is connected to the organic light emitting diode OLED. The second transistor TR2 controls a driving current flowing through the organic light emitting diode OLED in response to the voltage charged in the capacitor CAP.

The organic light emitting diode OLED includes an anode AND connected to the second transistor TR2 for receiving the first power source voltage ELVDD and a cathode CTD (refer to FIG. 7) for receiving a second power source voltage ELVSS. In addition, the organic light emitting diode OLED includes a light emitting layer EML disposed between the anode AND and the cathode CTD (refer to FIG. 7). The organic light emitting diode OLED emits light during a turn-on period of the second transistor TR2.

Figure 5:
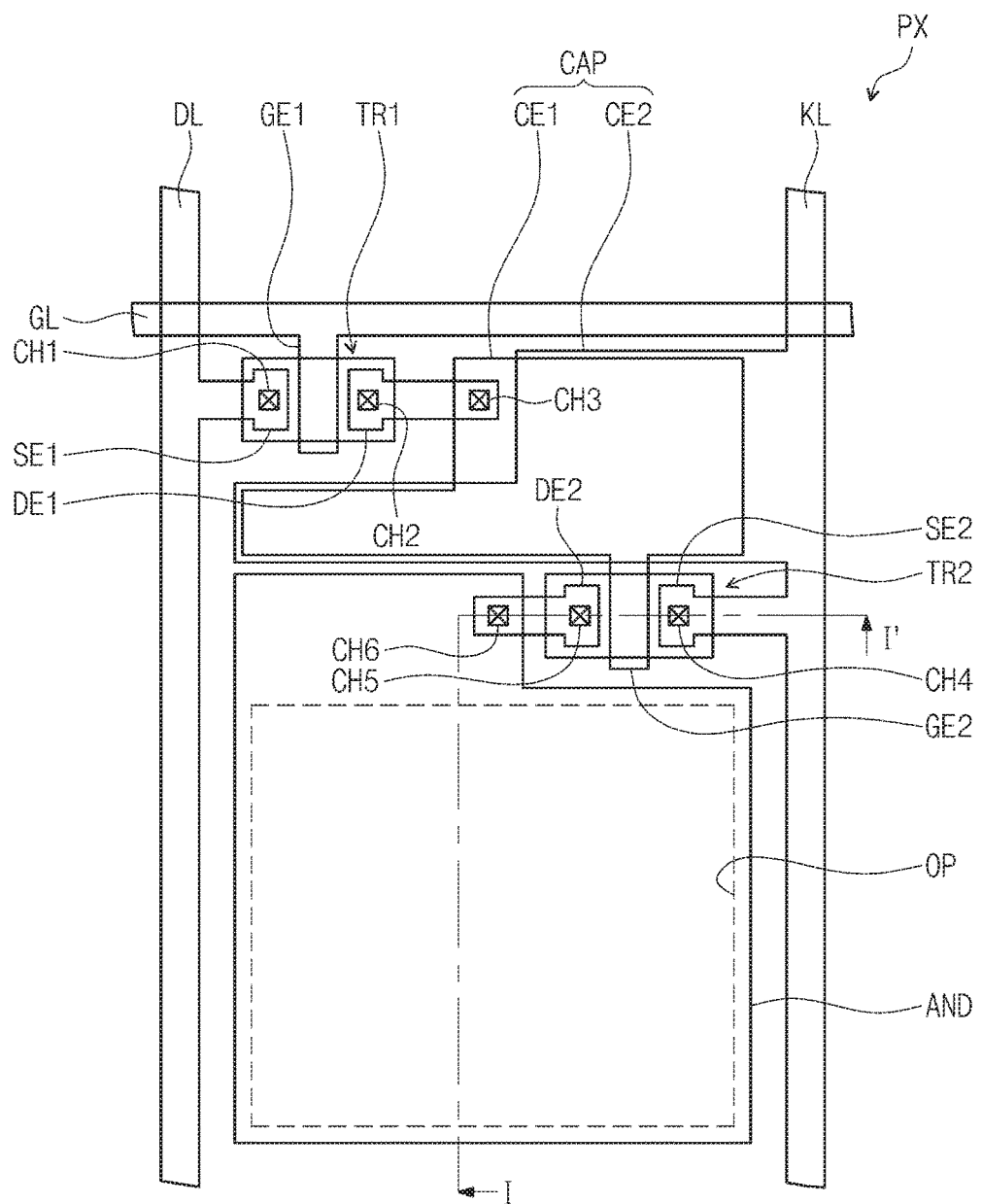
FIG. 5 is a layout diagram of a pixel according to an exemplary embodiment of the present disclosure.
Figure 6:
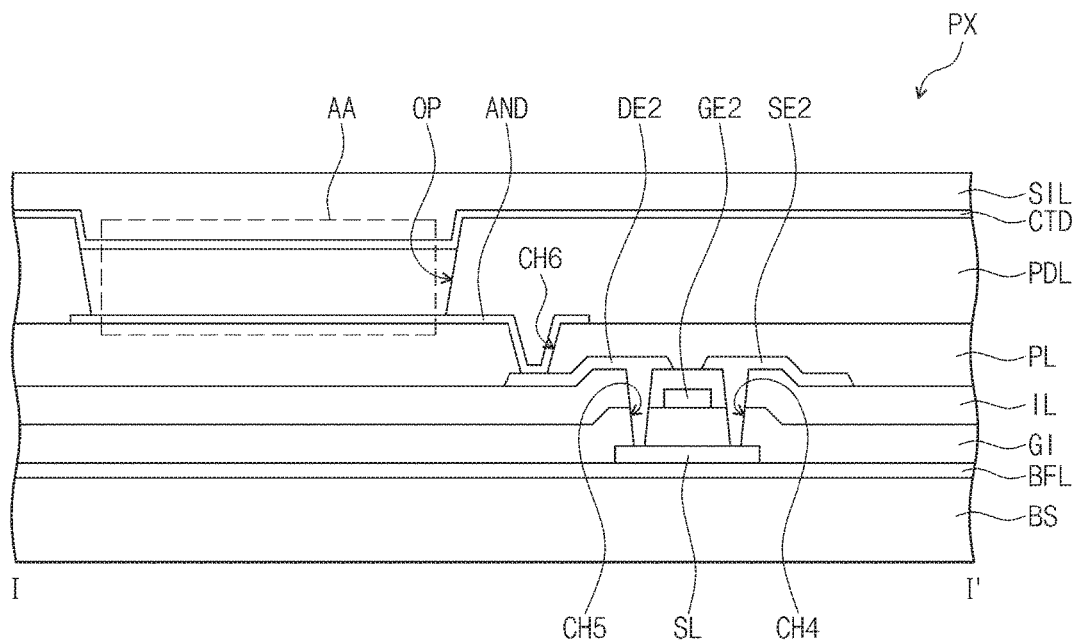
FIG. 6 is a cross-sectional view taken along the line I-I' of FIG. 5.

FIG. 5 is a layout diagram of a pixel PX according to an exemplary embodiment of the present disclosure, and FIG. 6 is a cross-sectional view taken along the line I-I' of FIG. 5. Hereinafter, the organic light emitting panel will be described in further detail with reference to FIGS. 5 and 6.

The organic light emitting display panel DP includes a base substrate BS, a buffer layer BFL, signal lines GL and DL, and pixels PX. The structure of the base substrate BS, the buffer layer BFL, the signal lines GL and DL, and the pixels PX may be changed depending on the kind (or type) of the organic light emitting display panel DP.

The buffer layer BFL is disposed on one surface (e.g., an upper surface) of the base substrate BS.

The buffer layer BFL prevents impurities existing in the base substrate BS from entering into (e.g., from migrating into) the pixels PX during manufacturing of the organic light emitting display panel DP. For example, the buffer layer BFL prevents the impurities from being diffused into a semiconductor layer SL of the pixel PX. The impurities are carried from the outside environment or generated by pyrolysis of the base substrate BS. The impurities may be gas discharged from the base substrate or sodium. In addition, the buffer layer BFL blocks moisture from entering the pixel PX from the outside.

The signal lines GL and DL and the pixel PX are disposed on the buffer layer BFL. The semiconductor layer SL of the second transistor TR2 is disposed on the buffer layer BFL. The semiconductor layer SL may include polycrystalline silicon or amorphous silicon formed at a low temperature (e.g., formed by a low temperature process). In addition, the semiconductor layer SL may include a metal oxide semiconductor.

The semiconductor layer SL includes a channel area serving as a path through which electrons or holes move, a first ion doping area, and a second ion doping area. The channel area is disposed between the first and second ion doping areas.

A gate insulating layer GI is disposed on the buffer layer BFL to cover the semiconductor layer SL. The gate insulating layer GI includes an organic layer and/or an inorganic layer. In one or more embodiments, the gate insulating layer GI may include a plurality of inorganic thin film layers. For example, the inorganic thin film layers may include a silicon nitride layer and a silicon oxide layer.

The gate line GL is disposed on the gate insulating layer GI. A control electrode GE1 (hereinafter referred to as a first control electrode) of the first transistor TR1 and a control electrode GE2 (hereinafter referred to as a second control electrode) of the second transistor TR2 are disposed on the gate insulating layer GI.

A first electrode CE1 of the capacitor CAP is disposed on the gate insulating layer GI, but the position of the first electrode CE1 should not be limited thereto or thereby. The first electrode CE1 and the gate lines GL are formed by the same or a substantially similar photolithography process. In one or more embodiments, the first electrode CE1 and the gate line may include the same material.

The first control electrode GE1, the second control electrode GE2, and an inter-insulating layer IL covering the first electrode CE1 are disposed on the gate insulating layer GI. The inter-insulating layer IL includes an organic layer and/or an inorganic layer. In one or more embodiments, the inter-insulating layer IL may include a plurality of inorganic thin film layers. For example, the inorganic thin film layers may include a silicon nitride layer and a silicon oxide layer.

The data line DL and a power source line KL are disposed on the inter-insulating layer IL. An input electrode SE1 (hereinafter referred to as a first input electrode) and an output electrode DE1 (hereinafter referred to as a first output electrode) of the first transistor TR1 are disposed on the inter-insulating layer IL. An input electrode SE2 (hereinafter referred to as a second input electrode) and an output electrode DE2 (hereinafter referred to as a second output electrode) of the second transistor TR2 are disposed on the inter-insulating layer IL. The first input electrode SE1 is branched from (e.g., extends from) the data line DL, and the second input electrode SE2 is branched from (e.g., extends from) the power source line KL.

A second electrode CE2 of the capacitor CAP is disposed on the inter-insulating layer IL, but the position of the second electrode CE2 should not be limited thereto or thereby. The second electrode CE2, the data line DL, and the power source line KL are formed by the same or a substantially similar photolithography process and include the same material.

The first input electrode SE1 and the first output electrode DE1 are connected to a semiconductor layer of the first transistor TR1 through respective first and second openings CH1 and CH2 (e.g., first and second thru-holes) formed through the gate insulating layer GI and the inter-insulating layer IL. The first output electrode DE1 is connected to the first electrode CE1 through a third opening CH3 (e.g., a third thru-hole) formed through the inter-insulating layer IL. The second input electrode SE2 and the second output electrode DE2 are connected to the semiconductor layer SL of the second transistor TR2 through respective fourth and fifth openings CH4 and CH5 (e.g., fourth and fifth thru-holes) formed through the gate insulating layer GI and the inter-insulating layer IL. In other embodiments, the first and second transistors TR1 and TR2 may each have a bottom gate structure.

A passivation layer PL is disposed on the inter-insulating layer IL to cover the first input electrode SE1, the first output electrode DE1, the second input electrode SE2, and the second output electrode DE2. The passivation layer PL includes an organic layer and/or an inorganic layer. For example, the passivation layer PL may include an organic material to provide a planar surface.

A pixel definition layer PDL and an organic light emitting diode OLED are disposed on the passivation layer PL. The anode AND is connected to the second output electrode DE2 through a sixth opening CH6 (e.g., a sixth thru-hole) formed through the passivation layer PL. However, in other embodiments, positions of the anode AND and the cathode CTD of the organic light emitting diode OLED may be changed with respect to each other.

The anode AND is disposed on the passivation layer PL. The pixel definition layer PDL has an opening OP formed therethrough to expose the anode AND.

A sealing layer SIL is disposed on the cathode CTD. The sealing layer SIL includes a plurality of thin film encapsulation layers. The thin film encapsulation layers include a silicon nitride layer and a silicon oxide layer.

Figure 7:
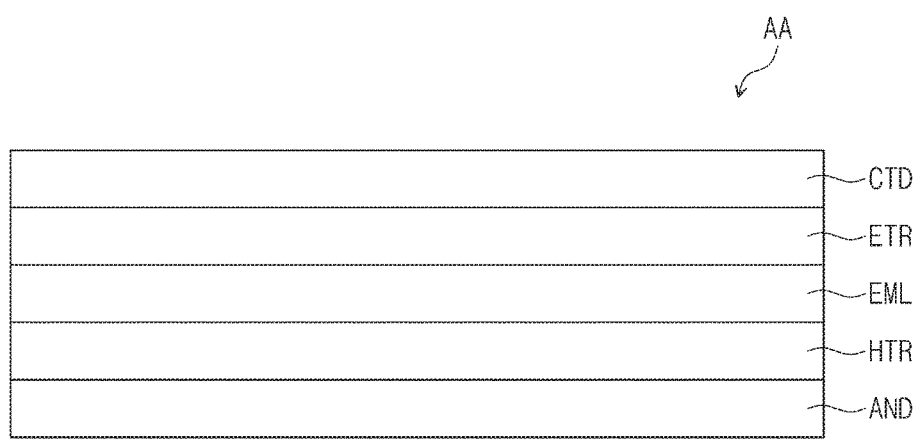
FIG. 7 is an enlarged cross-sectional view of the portion AA of FIG. 6.

FIG. 7 shows a cross-section of the organic light emitting diode OLED included in the pixel PX.

Referring to FIG. 7, the organic light emitting diode OLED includes the anode AND, a hole transport region HTR disposed on the anode AND, a light emitting layer EML disposed on the hole transport region HTR, an electron transport region ETR disposed on the light emitting layer EML, and the cathode CTD disposed on the electron transport region ETR.

The anode AND is disposed on the base substrate SUB and is conductive. The anode AND is a pixel electrode (e.g., a positive electrode). The anode AND is a transmissive electrode, a transflective electrode, or a reflective electrode.

In an embodiment in which the anode AND is the transmissive electrode, the anode AND may include a transparent metal oxide (e.g., indium tin oxide (ITO), indium zinc oxide (IZO), zinc oxide (ZnO), indium tin zinc oxide (ITZO), etc.). In an embodiment in which the anode AND is the transflective or reflective electrode, the anode AND may include Ag, Mg, Al, Pt, Pd, Au, Ni, Nd, Ir, Cr, or a mixture of two or more of these metals. The anode AND may have a single-layer structure of a transparent metal oxide or a metal or a multi-layer structure including plural layers. For instance, the anode AND may have a single-layer structure of ITO, Ag, or a metal mixture (e.g., a mixture of Ag and Mg), a double-layer structure of ITO/Mg or ITO/MgF, or a triple-layer structure of ITO/Ag/ITO.

The hole transport region HTR is disposed above the anode AND and injects/transports the holes. The hole transport region HTR includes a hole injection layer, a hole transport layer, and/or an electron blocking layer.

The hole transport region HTR may have a single-layer structure including a single material or plural different materials or a multi-layer structure including layers formed of different materials.

For instance, the hole transport region HTR may have the single-layer structure including different materials or a structure of hole injection layer/hole transport layer or hole injection layer/hole transport layer/electron blocking layer, which are sequentially stacked on the anode AND.

The hole transport region HTR may be formed by various methods, such as a vacuum deposition method, a spin coating method, a cast method, an LB (Langmuir-Blodgett) method, an inkjet printing method, a laser printing method, an LITI (Laser Induced Thermal Imaging) method, etc.

In an embodiment in which the hole transport region includes the hole injection layer, the hole transport region HTR may include, but is not limited to, a phthalocyanine compound, such as copper phthalocyanine, DNTPD (N,N'-diphenyl-N,N'-bis-[4-(phenyl-m-tolyl-amino)-phenyl]-bi-phenyl-4,4'-diamine), m-MTDATA(4,4',4"-tris(3-methyl-phenylphenylamino) triphenylamine), TDATA(4,4'4"-Tris (N,N-diphenylamino)triphenylamine), 2TNATA(4,4',4"-tris{N,-(2-naphthyl)-N-phenylamino}-triphenylamine), PEDOT/PSS(Poly(3,4-ethylenedioxythiophene)/Poly(4-styrenesulfonate), PANI/DBSA(Polyaniline/Dodecylbenzene-sulfonic acid), PANI/CSA(Polyaniline/Camphorsulfonic acid), PANI/PSS((Polyaniline)/Poly(4-styrenesulfonate), etc. The hole injection layer has a thickness within a range from about 100 angstroms to about 10000 angstroms (about 10 nm to about 1000 nm). In an embodiment in which the thickness of the hole injection layer satisfies the above-mentioned condition, satisfying hole injection characteristics may be obtained without raising or substantially raising the driving voltage.

In an embodiment in which the hole transport region includes the hole transport layer, the hole transport region HTR may include, but is not limited to, carbazole-based derivatives, such as n-phenyl carbazole, polyvinyl carbazole, etc., fluorine-based derivatives, triphenylamine-based derivatives, such as TPD(N,N'-bis(3-methylphenyl)-N,N'-diphenyl-[1,1-biphenyl]-4,4'-diamine), TCTA(4,4',4"-tris (N-carbazolyl)triphenylamine), etc., NPB(N,N'-di(1-naphthyl)-N,N'-diphenylbenzidine), TAPC(4,4'-Cyclohexylidene bis[N,N-bis(4-methylphenyl)benzenamine]), etc. The hole transport layer has a thickness within a range from about 50 angstroms to about 2000 angstroms (about 5 nm to about 200 nm). In an embodiment in which the thickness of the hole transport layer satisfies the above-mentioned condition, satisfying hole transport characteristics may be obtained without raising or substantially raising the driving voltage.

The hole transport region HTR may further include an electric charge generating material to improve the conductivity of the hole transport region. The electric charge generating material may be uniformly or non-uniformly distributed in the hole transport region HTR. The electric charge generating material may be, but is not limited to, a p-type dopant. The p-type dopant may be a quinone derivative, a metal oxide material, and/or a compound containing a cyano group but should not be limited thereto or thereby. For instance, the p-type dopant may include the quinone derivatives, such as TCNQ(Tetracyanoquinodimethane), F4-TCNQ(2,3,5,6-tetrafluoro-tetracyanoquinodimethane), etc., or the metal oxide material, such as a tungsten oxide material, a molybdenum oxide material, etc., but should not be limited thereto or thereby.

The light emitting layer EML is disposed on the hole transport region HTR. The light emitting layer EML may have a single-layer structure of a single material or plural different materials or a multi-layer structure including layers formed of different materials.

The light emitting layer EML may be formed by various methods, such as a vacuum deposition method, a spin coating method, a cast method, an LB (Langmuir-Blodgett) method, an inkjet printing method, a laser printing method, an LITI (Laser Induced Thermal Imaging) method, etc.

The light emitting layer EML may include materials for respectively emitting red, green, and blue lights and may include a fluorescent material or a phosphorescent material. The light emitting layer EML may include a host and a dopant.

As the host, for example, Alq3(tris(8-hydroxyquinolino) aluminum), CBP(4,4'-bis(N-carbazolyl)-1,1'-biphenyl), PVK(poly(n-vinylcabazole), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl) benzene), TBADN(3-tert-butyl-9,10-di(naphth-2-yl) anthracene), DSA(distyrylarylene), CDBP(4,4'-bis(9-carbazolyl)-2,2"-dimethyl-biphenyl), and/or MADN(2-

Methyl-9,10-bis(naphthalen-2-yl)anthracene) may be used, however, it should not be limited thereto or thereby.

When the light emitting layer EML is to emit red light, the light emitting layer EML may include a fluorescent material containing PBD:Eu(DBM)3(Phen)(tris(dibenzoylmethanato)phenanthoroline europium) or Perylene. As the dopant included in the light emitting layer EML when the light emitting layer EML is to emit red light, a metal complex, such as PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium), PtOEP(octaethylporphyrin platinum), etc., and/or an organometallic complex may be used.

When the light emitting layer EML is to emit green light, the light emitting layer EML may include a fluorescent material containing Alq3(Tris(8-hydroxyquinolino)aluminum). As the dopant included in the light emitting layer EML when the light emitting layer EML is to emit green light, a metal complex, for example, Ir(ppy)3(fac-tris(2-phenylpyridine)iridium), and/or an organometallic complex may be used.

When the light emitting layer EML is to emit blue light, the light emitting layer EML may include a fluorescent material including spiro-DPVBi, spiro-6P, DSB(distyryl-benzene), DSA(distyryl-arylene), PFO(Polyfluorene)-based polymer, and/or PPV(poly(p-phenylene vinylene)-based polymer. When the light emitting layer EML is to emit blue light, the dopant included in the light emitting layer EML may be selected from a metal complex, such as (4,6-F2ppy) 2Irpic, and/or an organometallic complex.

The electron transport region ETR is disposed on the light emitting layer EML and injects/transports the electrons. The electron transport region ETR includes an electron transport layer and an electron injection layer, but it should not be limited thereto or thereby.

As shown in FIG. 7, the electron transport region ETR has a structure of electron transport layer/electron injection layer, which are sequentially stacked on the light emitting layer EML. In addition, the electron transport region ETR may have a multi-layer structure including two or more layers, but it should not be limited thereto or thereby.

The electron transport region ETR may be formed by various methods, such as a vacuum deposition method, a spin coating method, a cast method, an LB (Langmuir-Blodgett) method, an inkjet printing method, a laser printing method, an LITI (Laser Induced Thermal Imaging) method, etc.

In an embodiment in which the electron transport region ETR includes the electron transport layer, the electron transport region ETR may include Alq3(Tris(8-hydroxyquinolinato)aluminum), TPBi(1,3,5-Tri(1-phenyl-1H-benzo[d] imidazol-2-yl)phenyl), BCP(2,9-Dimethyl-4,7-diphenyl-1, 10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3, 5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminum), Bebq2(berylliumbis(benzoquinolin-10-olate), ADN(9,10-di(naphthalene-2-yl)anthracene), and/or a mixture thereof, but it should not be limited thereto or thereby. The electron transport layer has a thickness in a range of about 100 angstroms to about 1000 angstroms (about 10 nm to about 100 nm). In an embodiment in which the thickness of the electron transport layer satisfies the above-mentioned range, superior electron transport characteristics may be obtained without raising or substantially raising the driving voltage.

In an embodiment in which the electron transport region ETR includes the electron injection layer, the electron transport region ETR may include a lanthanide-based metal, for example, LiF, LiQ (Lithium quinolate), $Li_2O$, BaO, NaCl, CsF, Yb, etc., and/or a metal halide, for example, RbCl, RbI, etc., but the present invention should not be limited thereto or thereby. The electron injection layer may include a mixture of an electron transport material and an organo metal salt having an insulating property. The organo metal salt has an energy band gap of about 4 eV or more. For example, the organo metal salt may include metal acetate, metal benzoate, metal acetoacetate, metal acetylacetonate, and/or metal stearate. The electron injection layer has a thickness in a range of about 1 angstroms to about 100 angstroms (about 0.1 nm to about 10 nm). In an embodiment in which the thickness of the electron injection layer satisfies the above-mentioned range, superior electron injection characteristics may be obtained without raising or substantially raising the driving voltage.

The cathode CTD is disposed on the electron transport region ETR and includes a metal or metal alloy having a low work function, an electrically conductive compound, or a mixture thereof. The cathode CTD is a common electrode (e.g., a negative electrode).

The cathode CTD is a transmissive, transflective, or reflective electrode. In an embodiment in which the cathode CTD is the transmissive electrode, the cathode CTD includes Li, Ca, LiF/Ca, LiF/Al, Al, Mg, BaF, Ba, Ag, or a compound thereof or mixture thereof, for example, a mixture of Ag and Mg. The cathode CTD may include an auxiliary electrode. The auxiliary electrode may include a transparent metal oxide, for example, indium tin oxide (ITO), indium zinc oxide (IZO), zinc oxide (ZnO), indium tin zinc oxide (ITZO), Mo, Ti, etc. In an embodiment in which the cathode CTD is the transflective electrode or the reflective electrode, the cathode CTD may include Ag, Mg, Cu, Al, Pt, Pd, Au, Ni, Nd, Ir, Cr, Li, Ca, LiF/Ca, LiF/Al, Mo, Ti, or a compound thereof or mixture thereof, for example, a mixture of Ag and Mg. In other embodiments, the cathode CTD may have a multi-layer structure including the transparent metal oxide, such as ITO, IZO, ZnO, ITZO, etc.

In an embodiment in which the organic light emitting diode OLED is a front surface light emitting type (e.g., a top emissive type), the anode AND is the reflective electrode and the cathode CTD is the transmissive electrode or the transflective electrode. In an embodiment in which the organic light emitting diode OLED is a rear surface light emitting type (e.g., a bottom emissive type), the anode AND is the transmissive electrode or the transflective electrode and the cathode CTD is the reflective electrode.

Figure 8:
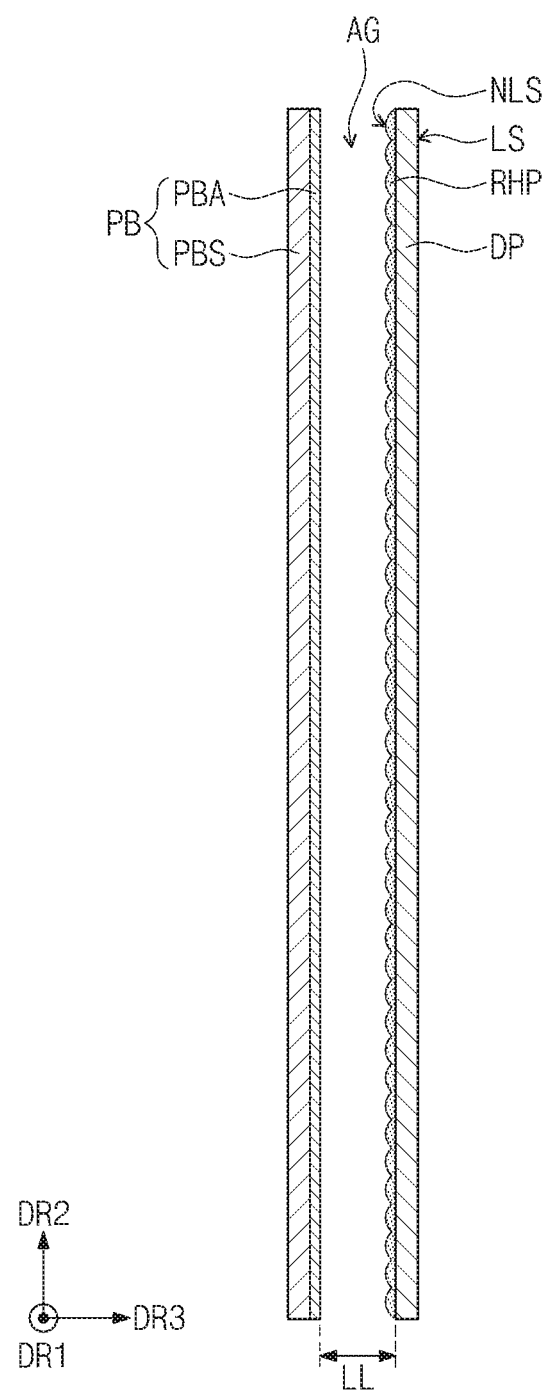
FIG. 8 is a cross-sectional view of an organic light emitting display panel and a protective member according to an exemplary embodiment of the present disclosure.

FIG. 8 is a cross-sectional view of an organic light emitting display panel DP and a protective member PB according to an exemplary embodiment of the present disclosure.

The organic light emitting display panel DP and the protective member PB are spaced from (e.g., spaced apart from) each other by a distance LL (e.g., by a predetermined distance or length). Accordingly, an air layer AG is formed between the organic light emitting display panel DP and the protective member PB. Due to the air layer AG between the organic light emitting display panel DP and the protective member PB (e.g., due to the distance between the organic light emitting display panel DP and the protective member PB), external impacts applied to the organic light emitting display panel DP are not transmitted to the protective member PB. In addition, impacts applied to the protective member PB are not transmitted to the organic light emitting display panel DP. Therefore, the display device DD may endure (e.g., may not be damaged by) external impacts due to the air layer AG.

The organic light emitting display panel DP includes a light emitting surface LS providing the image information IM (refer to FIG. 1) and a non-light emitting surface NLS opposite to the light emitting surface. A heat radiation layer RHP is disposed on the non-light emitting surface NLS.

The heat radiation layer RHP disposed on the non-light emitting surface NLS has an emissivity equal to or greater than about 0.8. The emissivity indicates a ratio of the thermal radiation level of a subject object to the thermal radiation level of a perfect black body. According to the Stefan-Boltzmann law, radiant energy (W) emitted per unit area (m$^2$) and per unit time (s) is as follows:

$$W = \varepsilon \times \sigma \times T^4$$

In the above equation, a unit of the radiant energy (W) is $J \cdot s^{-1} \cdot m^{-2}$ and $\varepsilon$ denotes emissivity and does not have a unit. $\sigma$ denotes a radiant constant (Stefan-Boltzmann constant), and the value of the radiant constant is $5.67 \times 10^{-8}$ $J \cdot s^{-1} \cdot m^{-2} \cdot K^{-4}$. T denotes an absolute temperature.

Heat is transferred by a variety of methods, such as conduction, convection, radiation, etc. Conduction indicates a phenomenon by which the heat is transferred by the transfer of movement of molecules. That is, the heat is transferred to a low temperature object or portion thereof from a high temperature object or portion thereof without involving the movement of materials. Convection indicates that the heat is transferred while molecules in a liquid or gaseous state move. Radiation indicates that the heat is directly transferred to a low temperature object from a high temperature object in the form of electromagnetic waves without the aid of materials.

Because the heat radiation layer RHP has an emissivity equal to or greater than about 0.8, heat generated by the organic light emitting display panel DP may be transferred (e.g., directly transferred) to the air layer AG by radiation.

The heat radiation layer RHP may be, but is not limited to, a coating layer of a heat radiation paint. In one such embodiment, a thickness in a third direction DR3 of the heat radiation layer RHP (e.g., a thickness direction of the heat radiation layer RHP) is in a range of about 20 micrometers to about 50 micrometers. In an embodiment in which the thickness of the heat radiation layer RHP is less than about 20 micrometers, heat from the organic light emitting display panel DP may not be effectively transferred to the air layer AG because heat radiation through the heat radiation layer RHP is small. In an embodiment in which the thickness of the heat radiation layer RHP is greater than about 50 micrometers, the display device DD may be more easily damaged by external impacts because the distance LL between the organic light emitting display panel DP and the protective member PB is relatively small.

In one embodiment, the heat radiation layer RHP may include ceramic composites. The ceramic composites are manufactured through the following processes. A metal oxide powder including iron oxide, silicon oxide, magnesium oxide, and aluminum oxide is prepared. Then, the metal oxide power is heat treated and melted to form a metal-oxide composite. The metal-oxide composite is rapidly cooled and crushed, producing the ceramic composites. The ceramic composites include about 60 weight % to about 85 weight % of iron oxide, about 13 weight % to about 30 weight % of silicon oxide, about 1 weight % to about 5 weight % of magnesium oxide, and about 1 weight % to about 5 weight % of aluminum oxide, but the heat radiation layer RHP should not be limited thereto or thereby. For example, the heat radiation layer RHP may include different materials such that the emissivity thereof is equal to or greater than about 0.8. In addition, the manufacturing method of the heat radiation layer RHP should not be limited to the above-mentioned method, and the heat radiation layer RHP may be manufactured using different methods.

The protective member PB includes a base layer PBS and an oxide layer PBA. The oxide layer PBA has an emissivity greater than that of the base layer PBS. The oxide layer PBA may be the heat absorbing layer described above.

The oxide layer PBA may include an oxide material of the base layer PBS. For example, the oxide layer PBA may be formed by oxidation of the base layer PBS. In one embodiment, the base layer PBS may include aluminum (Al), and the oxide layer PBA may include aluminum oxide.

The oxide layer PBA may be formed by an anodizing method. The anodizing method oxidizes or corrodes the surface of metal material to form the oxide layer. A porous surface formed by the anodizing method may be colored.

The anodizing method may be a soft anodizing process or a hard anodizing process. The soft anodizing process is performed to obtain a coloring effect for appearance and a smooth surface effect. The hard anodizing process coats the surface of the metal material with a ceramic film to obtain a wear resistant and electrically insulative surface. The hard anodizing process is performed by dipping aluminum in a chemical solution, oxidizing the aluminum to form a porous transparent oxide layer on the surface of the aluminum, and attaching or coating dyes onto the surface of the porous transparent oxide layer. The oxide layer PBA may be formed by soft-anodizing or hard-anodizing the base layer PBS.

The oxide layer PBA may be colored by a black dye (e.g., the oxide layer PBA may be black colored). In an embodiment in which the oxide layer PBA is black colored, the emissivity of the oxide layer PBA is increased due to characteristics of the black color.

Because emissivity is the same or substantially the same as absorptivity according to Kirchhoff's law of thermal radiation, as the absorptivity of an object increases, the emissivity thereof increases. Accordingly, as the absorptivity of the oxide layer PBA increases, the heat dissipated to the air layer AG from the organic light emitting display panel DP is more effectively or efficiently absorbed by the oxide layer PBA. Consequently, the heat generated by the organic light emitting display panel DP is dissipated through the air layer AG, the oxide layer PBA, and the base layer PBS.

Figure 9:
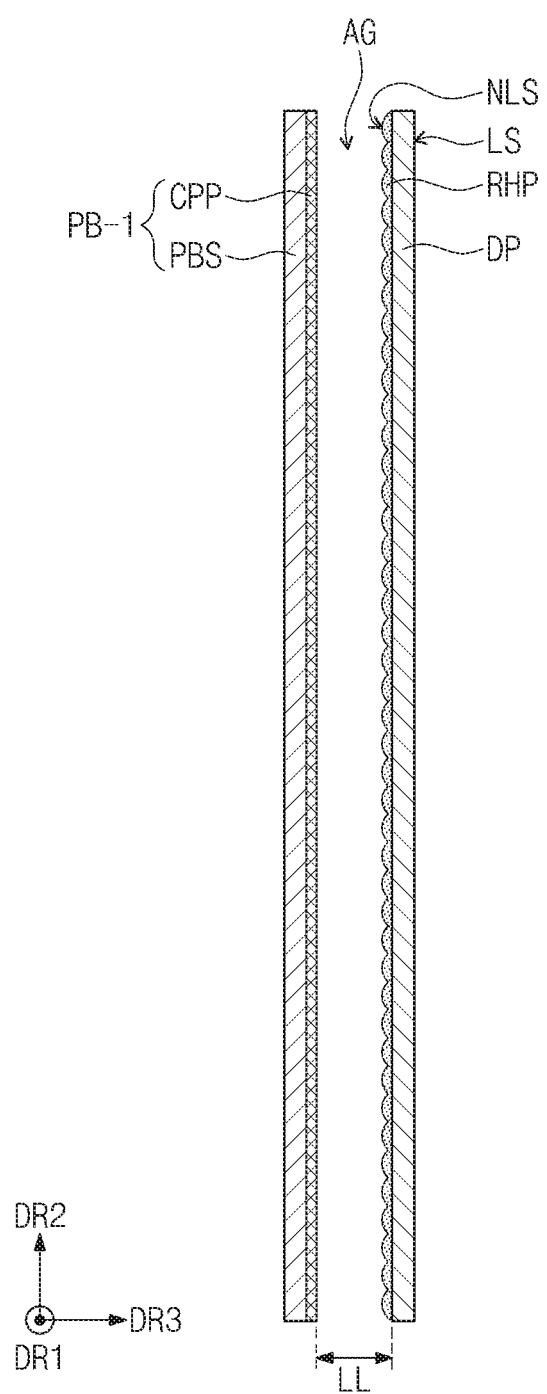
FIG. 9 is a cross-sectional view of an organic light emitting display panel and a protective member according to an exemplary embodiment of the present disclosure.

FIG. 9 is a cross-sectional view of an organic light emitting display panel DP and a protective member PB-1 according to an exemplary embodiment of the present disclosure. In the illustrated exemplary embodiment, an organic light emitting display panel DP, a heat radiation layer RHP, an air layer AG, and a base layer PBS have substantially the same structure and function as those shown in FIG. 8, and thus, details thereof may be omitted.

Referring to FIG. 9, the protective member PB-1 includes a copper layer CPP as the heat absorbing layer. That is, the copper layer CPP may be the heat absorbing layer.

Copper (Cu) has a heat conductivity greater than a heat conductivity of aluminum (Al). In an embodiment in which the base layer PBS includes aluminum (Al), the protective member PB-1 may easily or efficiently absorb heat from the air layer AG through the copper layer CPP that is adjacent to the base layer PBS.

The copper layer CPP may be colored by a black dye (e.g., may be black colored), and in this embodiment, the protective member PB-1 may more easily or efficiently absorb heat from the air layer AG because the heat conductivity of the copper layer CPP is relatively high.

Figure 10:
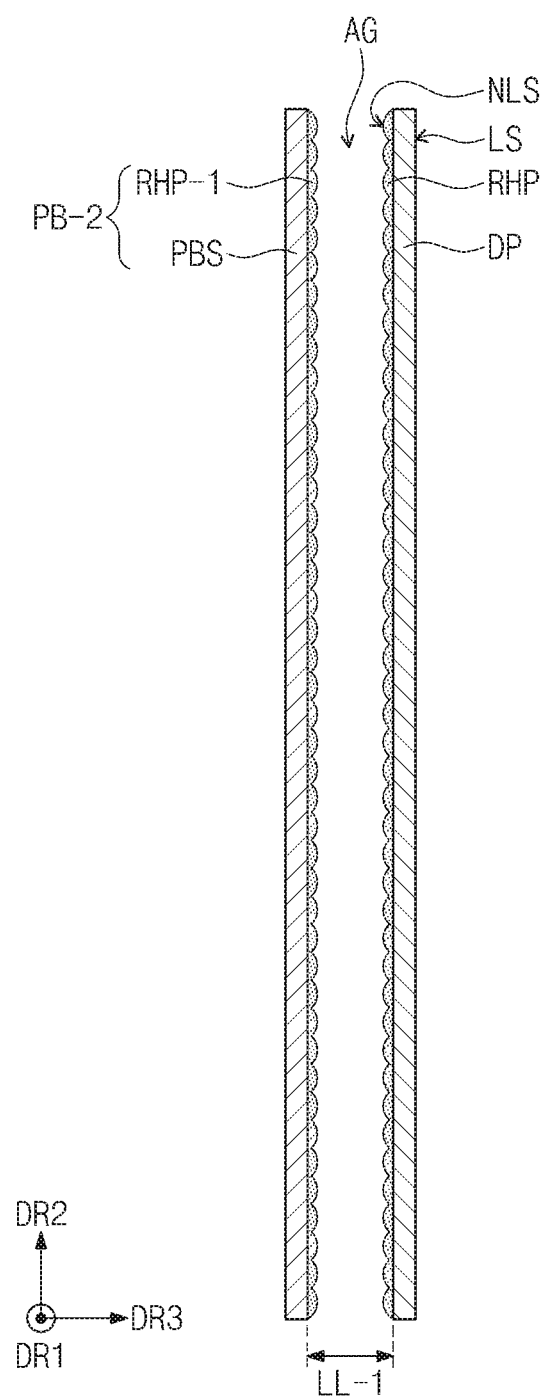
FIG. 10 is a cross-sectional view of an organic light emitting display panel and a protective member according to an exemplary embodiment of the present disclosure.

FIG. 10 is a cross-sectional view of an organic light emitting display panel DP and a protective member PB-2 according to an exemplary embodiment of the present disclosure. In the illustrated exemplary embodiment, an organic light emitting display panel DP, a heat radiation layer RHP, an air layer AG, and a base layer PBS have substantially the same structure and function as those shown in FIG. 8, and thus, details thereof may be omitted.

Referring to FIG. 10, the protective member PB-2 includes a heat radiation layer RHP-1. The heat radiation layer RHP-1 may be the same or substantially the same as the heat absorbing layer described above.

The heat radiation layer RHP-1 is disposed on one surface of the base layer PBS. The manufacturing method, the emissivity, and other characteristics of the heat radiation layer RHP-1 disposed on the surface of the base layer PBS are substantially the same as those of the heat radiation layer RHP disposed on the non-light emitting surface NLS of the organic light emitting display panel DP.

Figure 11:
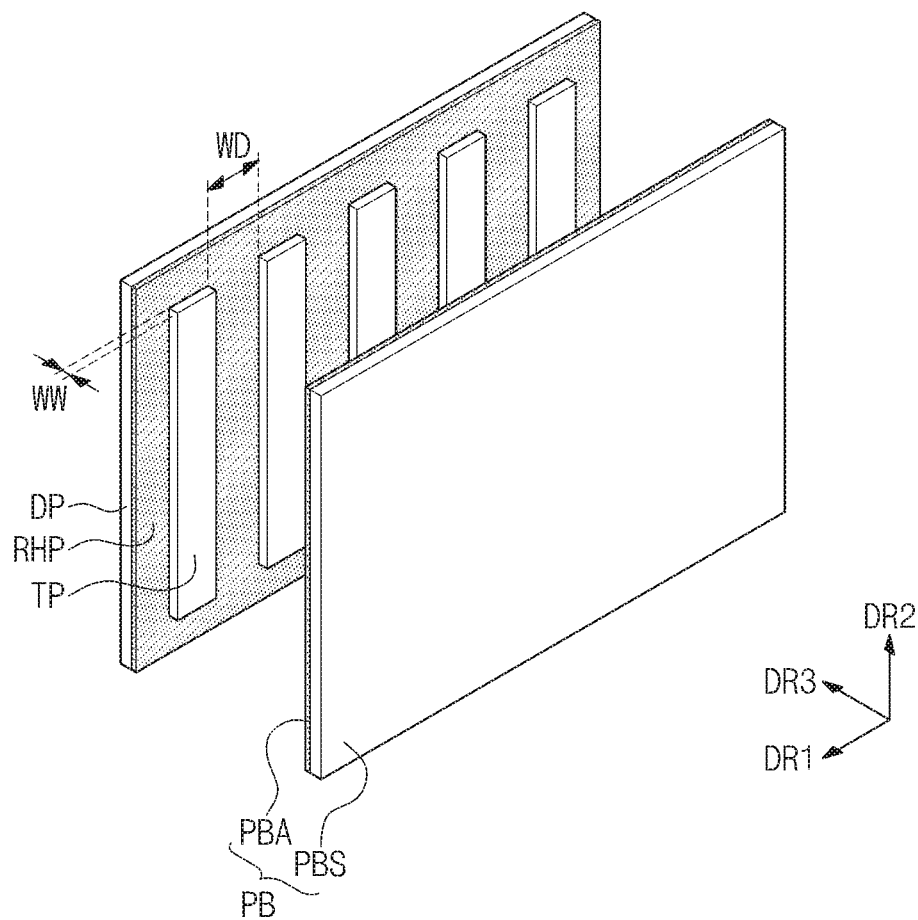
FIG. 11 is a perspective view of an organic light emitting display panel and a protective member according to an exemplary embodiment of the present disclosure.
Figure 12:
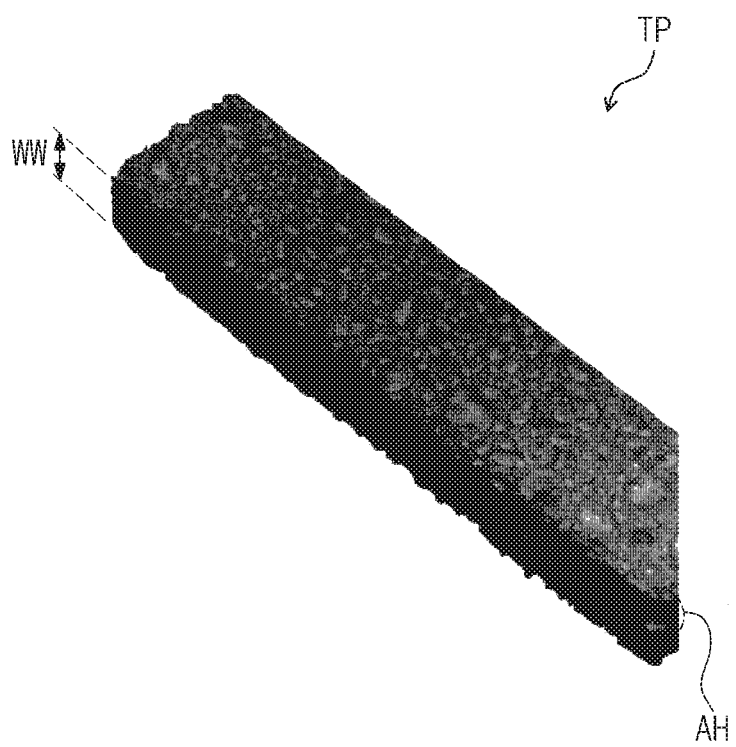
FIG. 12 is a perspective view of an adhesive member according to an exemplary embodiment of the present disclosure.

FIG. 11 is a perspective view of an organic light emitting display panel DP and a protective member PB according to an exemplary embodiment of the present disclosure, and FIG. 12 is a perspective view of an adhesive member TP according to an exemplary embodiment of the present disclosure. In FIGS. 11 and 12, an organic light emitting display panel DP, a heat radiation layer RHP, and a protective layer PB have substantially the same structure and function as those shown in FIG. 8, and thus, details thereof may be omitted.

Referring to FIG. 11, a plurality of adhesive members TP is disposed between the organic light emitting display panel DP and the protective member PB. The organic light emitting display panel DP is coupled to the protective member PB by the adhesive members TP.

Each of the adhesive members TP has a thickness WW (e.g., a predetermined thickness) in the third direction DR3. The thickness WW may be substantially the same as the distances LL and LL-1 shown in FIGS. 8-10. The adhesive members TP are arranged along the first direction DR1 and extend in the second direction DR2. The adhesive members TP are spaced from (e.g., spaced apart from) each other at regular intervals WD.

Referring to FIG. 12, each of the adhesive members TP includes air holes AH formed therein. The air holes AH absorb external impacts applied to the adhesive members TP. Accordingly, the adhesive members TP, including the air holes AH formed therein, are disposed between the organic light emitting display panel DP and the protective member PB and may absorb external impacts applied to the organic light emitting display panel DP or to the protective member PB.

The heat conductivity of the adhesive members TP may be greater than that of the organic light emitting display panel DP or the air layer AG. Therefore, heat generated by the organic light emitting display panel DP may be quickly transferred to the protective member PB through the adhesive members TP.

Figure 13:
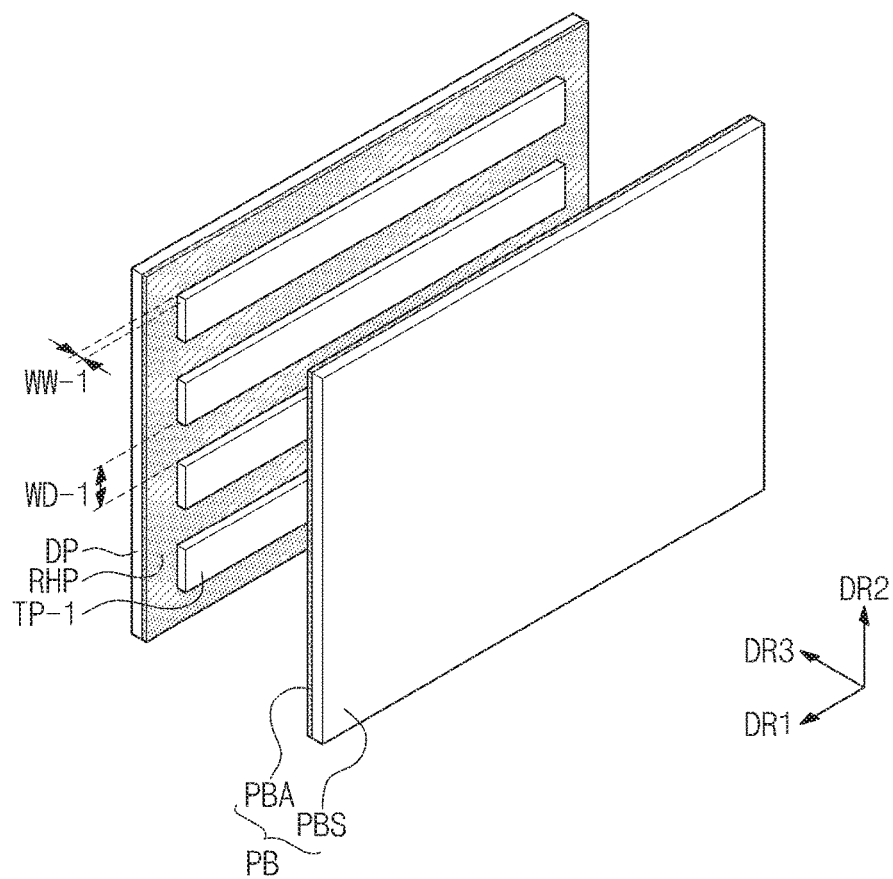
FIG. 13 is a perspective view of an organic light emitting display panel and a protective member according to an exemplary embodiment of the present disclosure.

FIG. 13 is a perspective view of an organic light emitting display panel DP and a protective member PB according to an exemplary embodiment of the present disclosure. In FIG. 13, an organic light emitting display panel DP, a heat radiation layer RHP, and a protective layer PB have substantially the same structure and function as those shown in FIG. 8, and thus, details thereof may be omitted.

Referring to FIG. 13, a plurality of adhesive members TP-1 is disposed between the organic light emitting display panel DP and the protective member PB. The organic light emitting display panel DP is coupled to the protective member PB by the adhesive members TP-1.

Each of the adhesive members TP-1 has a thickness WW-1 (e.g., a predetermined thickness) in the third direction DR3. The thickness WW-1 may be substantially the same as the thickness WW described above with reference to FIG. 12. The adhesive members TP-1 are arranged along the second thickness DR2 and extend in the first direction DR1. The adhesive members TP-1 are spaced from (e.g., spaced apart from) each other at regular intervals WD-1. Because the adhesive members TP-1 have the same or substantially the same structure and function as the adhesive members TP described above with reference to FIG. 12, detailed descriptions of the adhesive members TP-1 may be omitted.

Figure 14:
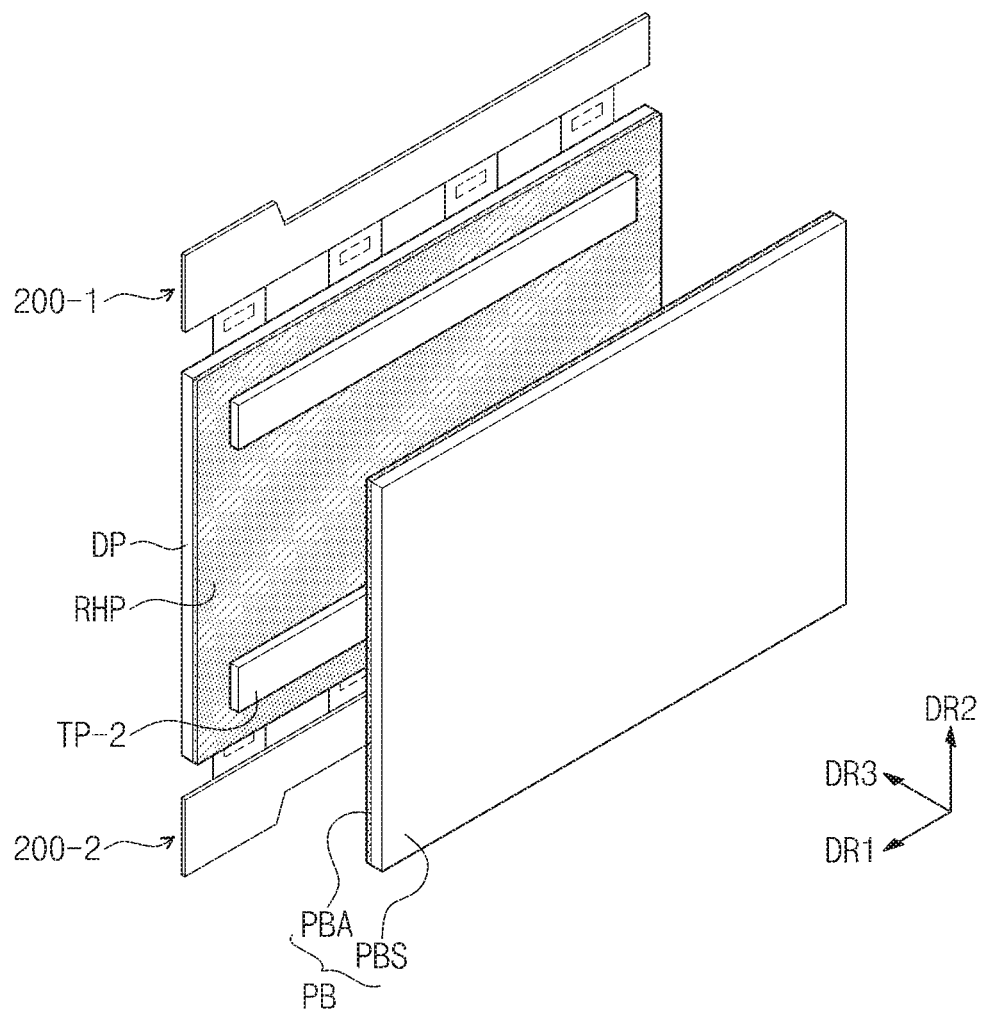
FIG. 14 is a perspective view of an organic light emitting display panel and a protective member according to an exemplary embodiment of the present disclosure.

FIG. 14 is a perspective view of an organic light emitting display panel DP and a protective member PB according to an exemplary embodiment of the present disclosure. In FIG. 14, an organic light emitting display panel DP, a heat radiation layer RHP, and a protective layer PB have substantially the same structure and function as those shown in FIG. 8, and thus, details thereof may be omitted.

Referring to FIG. 14, a first data driver 200-1 is disposed adjacent to one end EG1 of the organic light emitting display panel DP, and a second data driver 200-2 is disposed adjacent to another end EG2 (e.g., an opposite end) of the organic light emitting display panel DP. More heat is generated in areas adjacent to the ends EG1 and EG2 of the organic light emitting display panel DP than in other areas due to the first and second data drivers 200-1 and 200-2.

As shown in FIG. 14, when ones of the adhesive members TP-2 are disposed adjacent to the end EG1 and the other end EG2, heat generated in the areas adjacent to the ends EG1 and EG2 may be effectively discharged. The adhesive members TP-2 are substantially the same as the adhesive members TP described with reference to FIG. 12, and thus, details thereof may be omitted.

Figure 15:
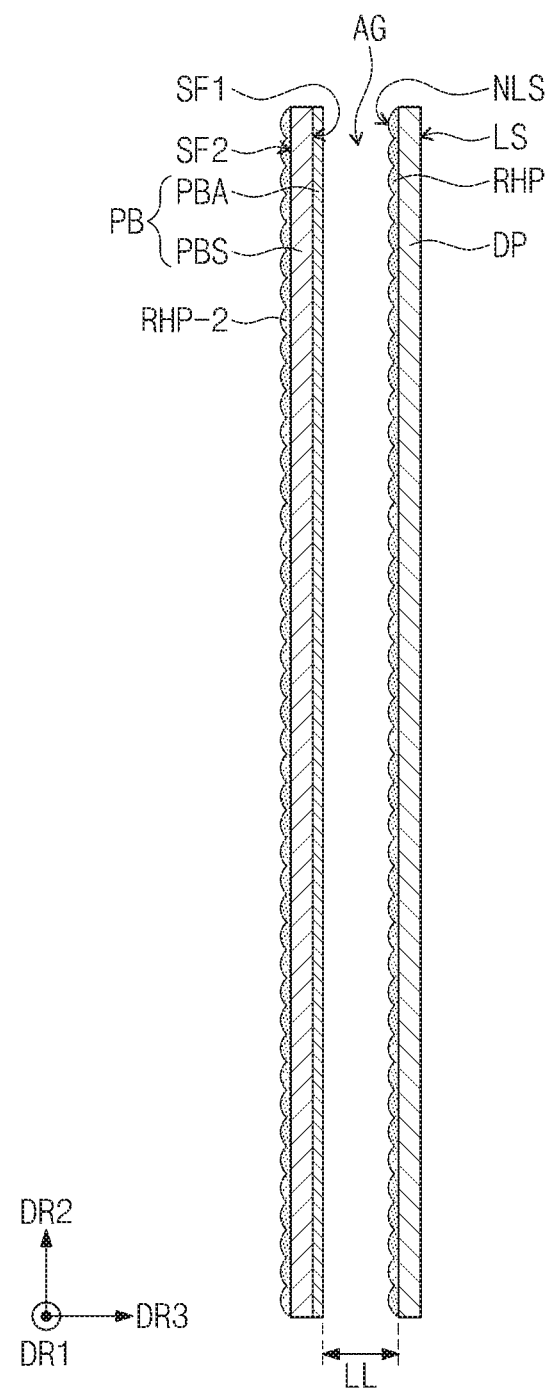
FIG. 15 is a cross-sectional view of an organic light emitting display panel and a protective member according to an exemplary embodiment of the present disclosure.

FIG. 15 is a cross-sectional view of an organic light emitting display panel DP and a protective member PB according to an exemplary embodiment of the present disclosure. In the present exemplary embodiment, the organic light emitting display panel DP, a heat radiation layer RHP, an air layer AG, and a protective layer PB have substantially the same structure and function as those shown in FIG. 8, and thus, details thereof may be omitted.

Referring to FIG. 15, a base layer PBS has a first surface SF1 contacting an oxide layer PBA (e.g., the oxide layer PBA is on the first surface SF1 of the base layer PBS) and a second surface SF2 opposite to the first surface SF1. A heat radiation layer RHP-2 is disposed on the second surface SF2. The manufacturing method, the emissivity, and other characteristics of the heat radiation layer RHP-2 disposed on the second surface SF2 are substantially the same as those of the heat radiation layer RHP disposed on the non-light emitting surface NLS of the organic light emitting display panel DP, described above.

The heat radiation layer RHP-2 disposed on the second surface SF2 dissipates heat absorbed by the protective member PB from the organic light emitting display panel DP through the air layer AG to the outside.

Figure 16:
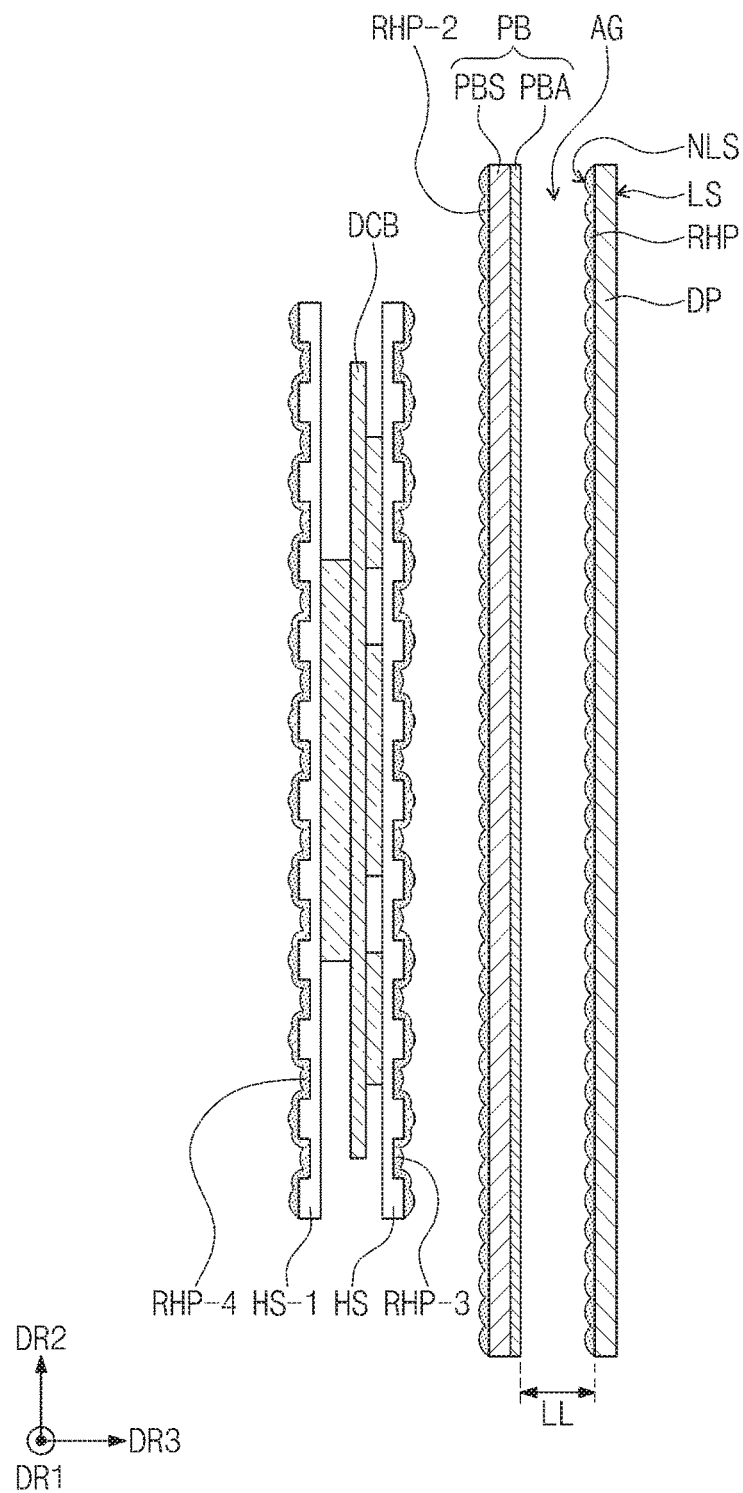
FIG. 16 is a cross-sectional view of an organic light emitting display panel, a protective member, a driving circuit board, and a heat dissipation member according to an exemplary embodiment of the present disclosure.

FIG. 16 is a cross-sectional view of an organic light emitting display panel DP, a protective member PB, a driving circuit board DCB, and heat dissipation member HS and HS-1 according to an exemplary embodiment of the present disclosure. In the present exemplary embodiment, the organic light emitting display panel DP, a heat radiation layer RHP, an air layer AG, and a protective layer PB have substantially the same structure and function as those shown in FIG. 8, and thus, details thereof may be omitted. In addition, a heat radiation layer RHP-2 disposed on the second surface SF2 is substantially the same as that described with reference to FIG. 15, and thus. details thereof may be omitted.

Referring to FIG. 16, the driving circuit board DCB is disposed at a rear side of the protective member PB. The driving circuit board PCB is spaced from (e.g., spaced apart from) the protective member PB by a distance (e.g., by a predetermined distance). The driving circuit board DCB and the protective member PB are spaced from each other with an air layer therebetween. The air layer serves as a heat insulating layer to insulate the driving circuit board DCB from the heat generated by the organic light emitting display panel DP.

The driving circuit board DCB may include circuit components, such as a timing controller. The driving circuit board DCB generates and outputs signals to drive the scan driver 100 and the data driver 200, but it should not be limited thereto or thereby. For example, the driving circuit board DCB may include various circuit components for generating signals to drive the organic light emitting display panel DP.

Each of the heat dissipation members HS and HS-1 is disposed adjacent to the driving circuit board DCB. Each of the heat dissipation members HS and HS-1 includes graphite having high heat conductivity in a plane direction, but the heat dissipation members HS and HS-1 should not be limited thereto or thereby. For example, the heat radiation layer RHP may have relatively high emissivity, and the heat dissipation members HS and HS-1 may have relatively high conductivity.

In an embodiment in which the heat dissipation members HS and HS-1 are disposed adjacent to the driving circuit board DCB, the amount of heat transmitted from the driving circuit board DCB to the organic light emitting display panel DP is reduced, and thus, a temperature of the organic light emitting display panel DP may not be increased due to the driving circuit board DCB.

Heat radiation layers RHP-3 and RHP-4 are respectively disposed on the heat dissipation members HS and HS-1. The manufacturing method, the emissivity, and other characteristics of the heat radiation layers RHP-3 and RHP-4 respectively disposed on the heat dissipation members HS and HS-1 are substantially the same as those of the heat radiation layer RHP disposed on the non-light emitting surface NLS of the organic light emitting display panel DP. The heat radiation layers RHP-3 and RHP-4 allow the heat dissipation members HS and HS-1 to more effectively insulate the organic light emitting display panel DP from the driving circuit board DCB.

Figure 17:
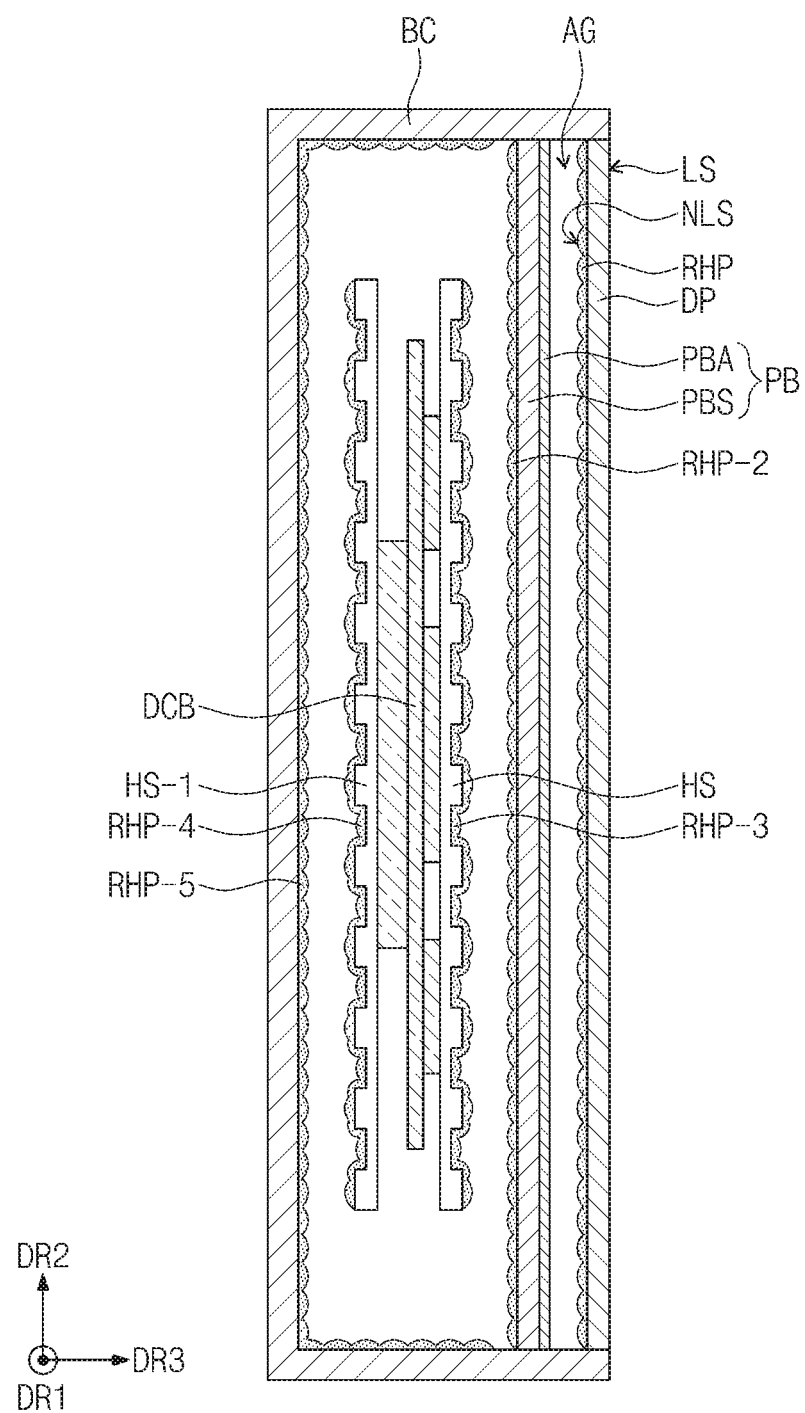
FIG. 17 is a cross-sectional view of an organic light emitting display panel, a protective member, a driving circuit board, a heat dissipation member, and a bottom cover according to an exemplary embodiment of the present disclosure.

FIG. 17 is a cross-sectional view of an organic light emitting display panel DP, a protective member PB, a driving circuit board DCB, heat dissipation members HS and HS-1, and a bottom cover BC according to an exemplary embodiment of the present disclosure. In the illustrated exemplary embodiment, the organic light emitting display panel DP, a heat radiation layer RHP, an air layer AG, and a protective layer PB have substantially the same structure and function as those shown in FIG. 8, and thus, details thereof may be omitted. In addition, a heat radiation layer RHP-2 disposed on the second surface SF2 is substantially the same as that described above with reference to FIG. 16, and thus, details thereof may be omitted. The driving circuit substrate DCB, the heat dissipation members HS and HS-1, and the heat radiation layers RHP-3 and RHP-4 are substantially the same as those described with reference to FIG. 16, and thus, details thereof may be omitted.

Referring to FIG. 17, the bottom cover BC covers the organic light emitting display panel DP, the protective member PB, the driving circuit board DCB, and the heat dissipation members HS and HS-1 to protect the organic light emitting display panel DP, the protective member PB, the driving circuit board DCB, and the heat dissipation members HS and HS-1 from external impacts and external contaminants.

A heat radiation layer RHP-5 may be disposed on an inner surface of the bottom cover BC. The manufacturing method, the emissivity, and other characteristics of the heat radiation layer RHP-5 disposed on the inner surface of the bottom cover BC are substantially the same as those of the heat radiation layer RHP disposed on the non-light emitting surface NLS of the organic light emitting display panel DP.

Although exemplary embodiments of the present invention have been described herein, it is understood that the present invention should not be limited to these exemplary embodiments and that various changes and modifications can be made by one ordinary skilled in the art within the spirit and scope of the present invention, as set forth in the following claims and their equivalents.

What is claimed is:

1. An organic light emitting display comprising:
    an organic light emitting display panel comprising a base substrate and a plurality of organic light emitting diodes on a first surface of the base substrate, the organic light emitting display panel having a light emitting surface adjacent the organic light emitting diodes and a non-light emitting surface opposite the light emitting surface and located at a second surface of the base substrate;
    a heat radiation layer on the non-light emitting surface and having an emissivity equal to or greater than about 0.8 and less than about 1; and
    a protective member spaced from the heat radiation layer such that an air layer is between the protective member and the heat radiation layer, the protective member comprising a base layer and a heat absorbing layer having an emissivity greater than an emissivity of the base layer,
    wherein each of the heat absorbing layer having the emissivity greater than an emissivity of the base layer and the heat radiation layer having the emissivity equal to or greater than about 0.8 and less than about 1 is directly adjacent the air layer.

2. The organic light emitting display of claim 1, wherein the base layer comprises a material, and
    wherein the heat absorbing layer comprises an oxide of the material of the base layer.

3. The organic light emitting display of claim 2, wherein the base layer comprises aluminum.

4. The organic light emitting display of claim 2, wherein the heat absorbing layer has a black color.

5. The organic light emitting display of claim 1, further comprising a plurality of adhesive members between the organic light emitting display panel and the protective member and coupling the organic light emitting display panel and the protective member to each other.

6. The organic light emitting display of claim 5, wherein each of the adhesive members has a plurality of air holes.

7. The organic light emitting display of claim 5, wherein each of the adhesive members has a heat conductivity greater than a heat conductivity of the organic light emitting display panel.

8. The organic light emitting display of claim 7, further comprising:
   a first data driver adjacent to a first side of the organic light emitting display panel; and
   a second data driver adjacent to a second side of the organic light emitting display panel,
   wherein one of the adhesive members is adjacent to the first side or the second side of the organic light emitting display panel.

9. The organic light emitting display of claim 1, further comprising a heat radiation layer on one surface of the base layer,
   wherein the heat radiation layer has an emissivity equal to or greater than about 0.8 and less than about 1.

10. The organic light emitting display of claim 9, further comprising:
    a driving circuit board for controlling signals to drive the organic light emitting display panel; and
    a heat dissipation member adjacent to the driving circuit board to block heat dissipated from the driving circuit board to the organic light emitting display panel.

11. The organic light emitting display of claim 10, further comprising a heat radiation layer on the heat dissipation member,
    wherein the heat radiation layer has an emissivity equal to or greater than about 0.8 and less than about 1.

12. The organic light emitting display of claim 11, further comprising a bottom cover in which the organic light emitting display panel, the protective member, the driving circuit board, and the heat dissipation member are arranged,
    wherein the bottom cover comprises a heat radiation layer having an emissivity equal to or greater than about 0.8 and less than about 1.

13. The organic light emitting display of claim 1, wherein the heat absorbing layer comprises copper.

14. The organic light emitting display of claim 13, wherein the heat absorbing layer has a black color.

15. The organic light emitting display of claim 14, wherein the base layer comprises aluminum.

16. The organic light emitting display of claim 1, wherein the heat absorbing layer comprises a heat radiation layer having an emissivity equal to or greater than about 0.8 and less than about 1.

17. The organic light emitting display of claim 1, wherein the heat radiation layer comprises a heat radiation paint.

18. The organic light emitting display of claim 1, wherein the heat radiation layer has a thickness equal to or greater than about 20 micrometers and equal to or less than about 50 micrometers.

19. The organic light emitting display of claim 1, wherein the heat radiation layer comprises at least one of iron oxide, silicon oxide, magnesium oxide, or aluminum oxide.

20. A display device comprising:
    an organic light emitting display panel comprising a first surface providing image information and a second surface coated with a heat radiation paint having an emissivity equal to or greater than about 0.8 and less than about 1; and
    a protective member comprising a first surface facing the second surface of the organic light emitting display panel, the first surface of the protective member comprising a metal oxide layer configured to absorb heat radiated from the heat radiation paint, the entire first surface of the protective member being physically separate from the organic light emitting display panel such that the entire first surface of the protective member is spaced from the second surface of the organic light emitting display panel with a single, continuous air gap between the entire first surface of the protective member and the second surface of the organic light emitting display panel,
    wherein the organic light emitting display panel comprises a display area, and the air gap overlaps the entire display area.

* * * * *